United States Patent

Tsuchida et al.

[11] Patent Number: 6,112,355
[45] Date of Patent: Sep. 5, 2000

[54] OVERFLOW SCRUB-WASHING METHOD AND APPARATUS

[75] Inventors: Shigenori Tsuchida; Minoru Yamahira, both of Ayase, Japan

[73] Assignee: Speedfam Clean System Co., Ltd., Ayase, Japan

[21] Appl. No.: 09/136,516

[22] Filed: Aug. 19, 1998

[30] Foreign Application Priority Data

Sep. 19, 1997 [JP] Japan .................................... 9-273971

[51] Int. Cl.[7] .................................................. B08B 1/04
[52] U.S. Cl. ................................................. 15/77; 15/102
[58] Field of Search ............................. 15/77, 102, 21.1, 15/88.2, 97.1; 134/902

[56] References Cited

U.S. PATENT DOCUMENTS

| | | | |
|---|---|---|---|
| 3,800,349 | 4/1974 | Green ........................................ | 15/102 |
| 3,938,213 | 2/1976 | DiFede ....................................... | 15/77 |
| 4,119,991 | 10/1978 | Martino ...................................... | 15/102 |
| 5,723,019 | 3/1998 | Krusell et al. ............................ | 134/902 |
| 5,727,582 | 3/1998 | Terui . | |
| 5,806,137 | 9/1998 | Ishi et al. .................................. | 15/77 |
| 5,890,251 | 4/1999 | Terui ......................................... | 15/102 |

FOREIGN PATENT DOCUMENTS

| | | |
|---|---|---|
| 61-8734 | 1/1986 | Japan . |
| 4-22411 | 5/1992 | Japan . |

Primary Examiner—Robert J. Warden, Sr.
Assistant Examiner—Kaj K. Olsen
Attorney, Agent, or Firm—Oblon, Spivak, McClelland, Maier & Neustadt, P.C.

[57] ABSTRACT

A washing liquid is continuously supplied upward from the bottom of an inner vessel in such a way that the liquid overflows the top of the vessel while platelike workpieces are entirely immersed in the washing liquid in such a way as to lie parallel with the flow of the liquid. The workpieces are washed in the flow of the washing liquid using washing brushes.

11 Claims, 3 Drawing Sheets

OVERFLOW SCRUB-WASHING METHOD AND APPARATUS

FIELD OF THE INVENTION

The present invention relates to a scrub-washing method and apparatus that uses brushes to wash workpieces such as magnetic disc substrates, glass substrates, or ceramic substrates, or platelike electronic, optical, or mechanical parts.

PRIOR ART

Scrub-washing apparatuses that use brushes to wash platelike workpieces such as magnetic disc substrates are well known and are described in, for example, Japanese Patent Application Laid Open No. 61-8734 and Japanese Utility Model Laid Open No. 4-22411.

Conventional scrub-washing apparatuses of this kind generally have a nozzle that sprays a washing liquid in the form of a shower to wash workpieces using brushes.

The method for washing workpieces while spraying a washing liquid from a nozzle is appropriate in the case that, because a relatively small amount of foreign matter is present on the workpieces, a large amount of washing liquid need not be supplied. Due to the limitation on the amount of washing liquid that can be supplied through the nozzle, however, this method is not necessarily appropriate if a large amount of washing liquid must be supplied in order to ensure that attached foreign matter is removed and washed away to prevent it from re-attaching to the workpieces or brushes (for example, if the workpieces are washed immediately after processing while polishing agents or other substances are still attached to them).

In addition, if a large amount of washing liquid is sprayed through the nozzle onto the workpieces, splashing may result. A measure to prevent splashing (for example, a hood) must therefore be provided.

DISCLOSURE OF THE INVENTION

The main technical object of this invention is to provide a scrub washing method and apparatus that can wash workpieces reliably while uniformly supplying a sufficient amount of washing liquid.

One subordinate technical object of this invention is to provide a scrub-washing method and apparatus that can use a washing liquid to immediately wash away foreign matter that has been removed from workpieces in order to effectively prevent it from re-attaching to the workpieces or washing brushes.

Another subordinate technical object is to provide a safe, clean scrub-washing method and apparatus that prevent the washing liquid from splashing.

Yet another subordinate technical object is to provide a scrub-washing apparatus that uses a simple seal mechanism to reliably prevent the washing liquid from leaking.

Still another subordinate technical object is to provide a scrub-washing apparatus with a simple structure that allows its parts to be processed easily.

To achieve all these objects, this invention continuously supplies a washing liquid upward from the bottom of a washing vessel in such a way that it overflows from the top of the vessel, while simultaneously immersing in the washing liquid platelike workpieces supported on a tray in such a way as to lie parallel with the flow of the liquid, and washes the workpieces in the flow of the washing liquid using washing brushes.

Since this invention brush-washes the workpieces immersed in the washing liquid, it washes them effectively and enables attached foreign matter to be simply and reliably removed. Furthermore, because this invention does not use a washing liquid simply stored in the washing vessel but causes the washing liquid to overflow from the washing vessel while washing the workpieces in the flow, foreign matter removed from the workpieces overflows together with the washing liquid and is discharged quickly to the exterior of the apparatus, and does not re-attach to the workpieces or washing brushes.

In particular, the washing brushes come into contact with the upper halves of the workpieces to wash them on the downstream side of the rising flow of the washing liquid. Therefore, since removed foreign matter immediately leaves the workpieces and overflows from the vessel, this invention is effective in preventing foreign matter from re-attaching.

According to one specific configuration, the washing vessel has a double structure consisting of an inner vessel from which the washing liquid overflows, and an outer vessel that receives the overflowing washing liquid. An elevating shaft in an elevating means elevationally penetrates the bottom wall of the outer vessel, and a tray is attached to the top of the elevating shaft. The elevating shaft is surrounded by vertical pipe members for liquid proofing, the lower ends of which are fixed to the bottom wall of the outer vessel in a liquid-tight manner, with the tip of each pipe member higher than the position at which the washing liquid overflows from the inner vessel.

This configuration ensures that the pipe members prevent the washing liquid that overflows from the inner vessel from flowing into a sliding portion between the bottom wall of the outer vessel and the elevating shaft. Therefore, only a simple seal structure need be provided in the sliding portion. The use of such a simple seal structure simplifies the structure of the apparatus, thereby facilitating the processing and assembly of the parts.

DESCRIPTION OF THE PREFERRED EMBODIMENTS

One embodiment of an overflow scrub-washing apparatus according to this invention is described below in detail with reference to the drawings.

Figure 1:
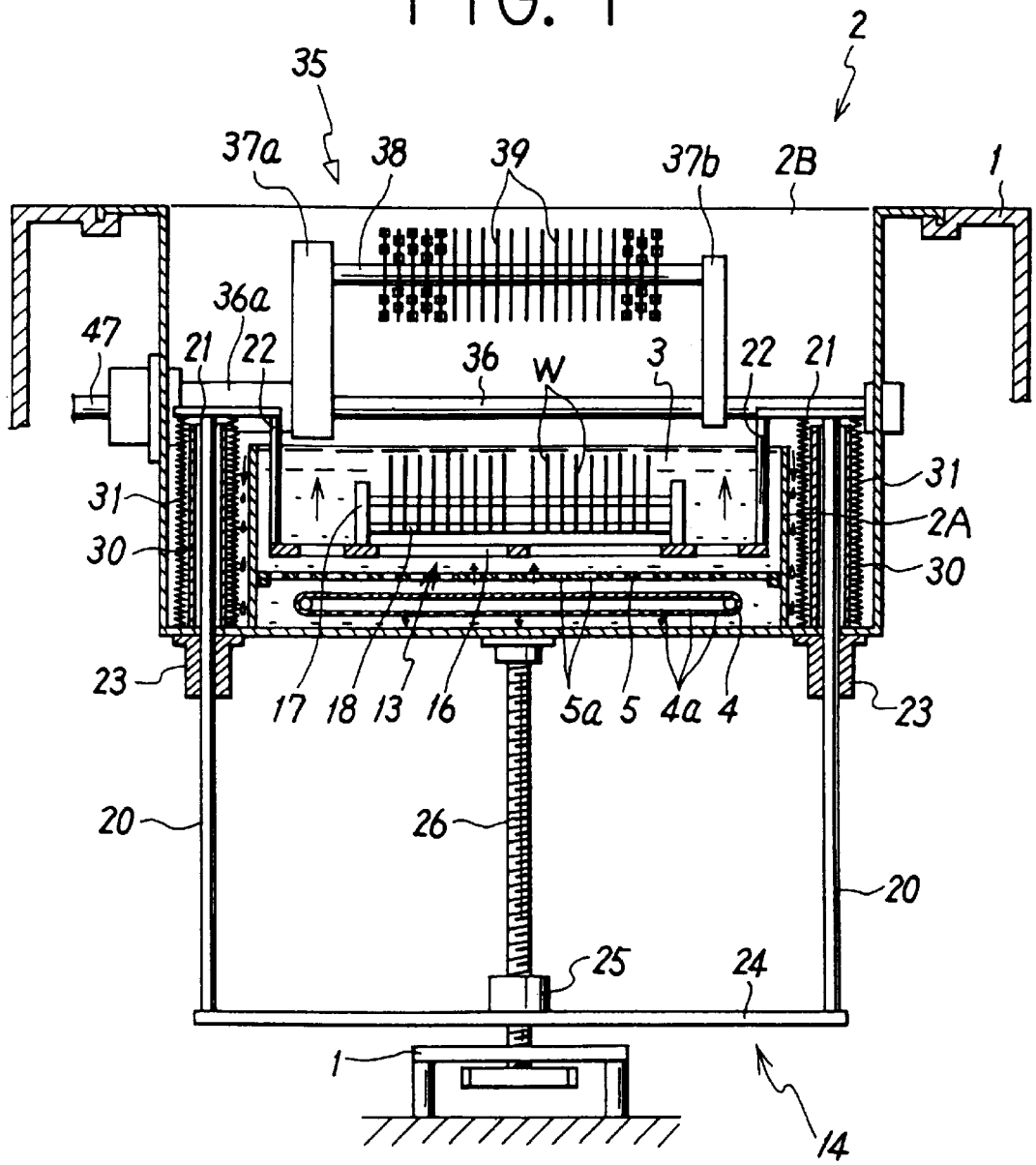
FIG. 1 is a vertical sectional front view showing one embodiment of a washing apparatus according to this invention.
Figure 2:
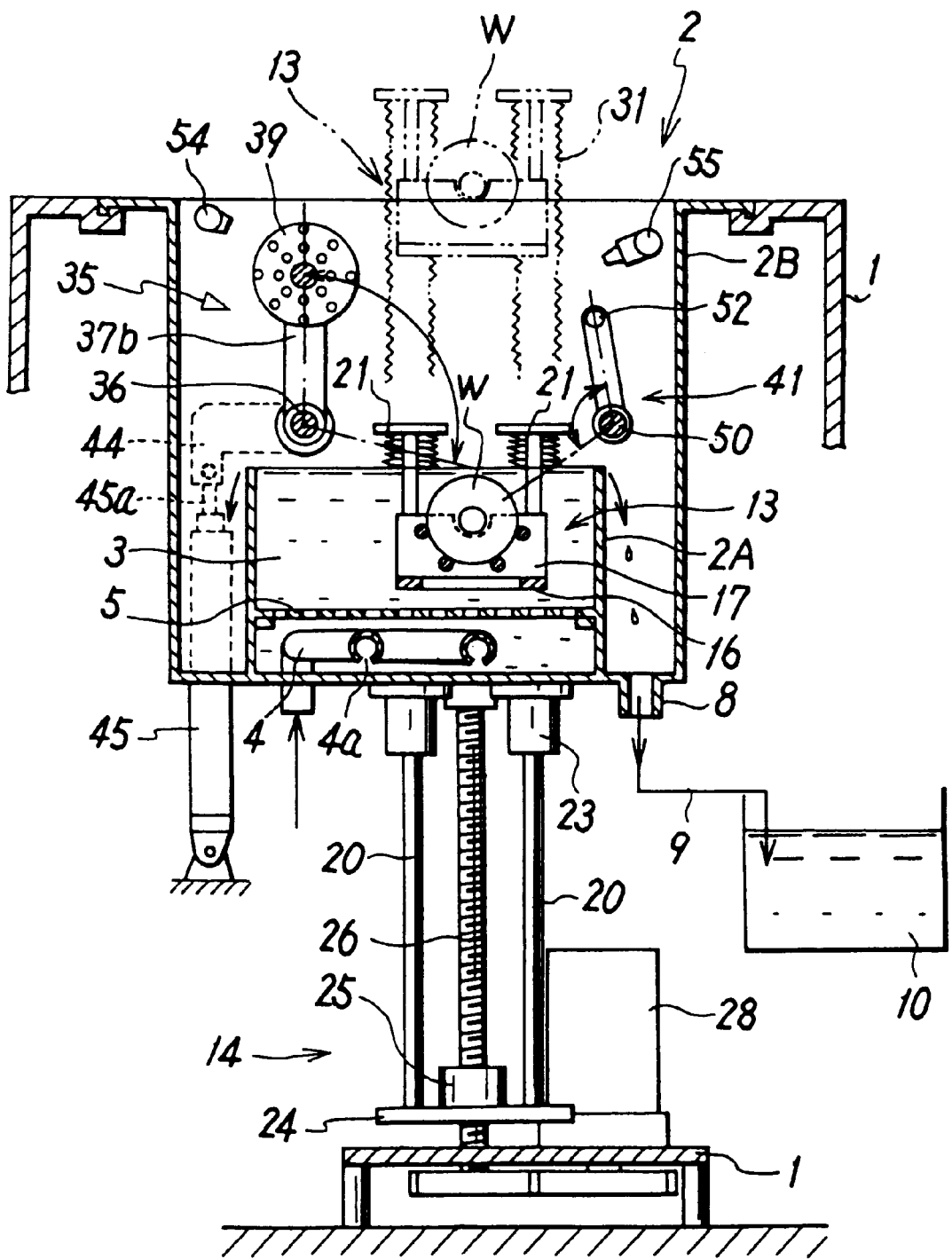
FIG. 2 is a vertical sectional side view of the washing apparatus in FIG. 1.

In FIGS. 1 and 2, a main body 1 of a washing apparatus is partly shown, and a washing vessel 2 that washes workpieces W is provided in the upper part of the main body 1.

The washing vessel 2 has a double structure including a low inner vessel 2A configured to continuously supply a washing liquid 3 upward from the bottom of the vessel in such a way that it overflows from the top of the vessel; and a high outer vessel 2B that surrounds the inner vessel 2A to receive the overflowing washing liquid.

A liquid-supply pipe 4 that supplies a washing liquid is provided in the internal bottom portion of the inner vessel 2A in such a way that its ejection opening 4a faces downward. The liquid-supply pipe 4 is connected to a liquid source (not shown) that supplies tap water, purified water, a washing solution, or a chemical agent. The washing liquid 3 ejected downward from the ejection opening 4a of the liquid supply pipe 4 collides against the bottom of the vessel, changes its course, then rises through the vessel before overflowing from the upper end of a vessel wall.

The flow velocity at which the washing liquid rises through the inner vessel 2A is generally about 3 to 15 mm/sec. (The appropriate flow velocity depends on the type of workpieces, the degree of contamination, and the type of washing liquid.)

To render the rising flow of the washing liquid 3 uniform and parallel, a straightening vane 5 including multiple through-holes 5a is provided inside the inner vessel 2A and above the liquid-supply pipe 4. The straightening vane 5 consists of a plate of synthetic resin in which the through-holes are drilled at a desired size. Although the illustrated example includes only one straightening vane 5, multiple such vanes may be provided at appropriate intervals. In this case, the size of through-holes may be the same or different.

Alternatively, a straightening vane consisting of a fibrous plate such as a piece of nonwoven fabric may be used instead of the straightening vane 5 consisting of a porous plate described above, or straightening vanes consisting of porous plates and fibrous plates may be used together.

A discharge opening 8, through which the washing liquid overflowing from the inner vessel 2A is discharged, is formed in the bottom wall of the outer vessel 2B, and the discharge opening 8 is connected to a recovery tank 10 via a recovery pipe 9. The washing liquid collected in the recovery tank 10 can be purified and recycled.

A tray 13 that supports multiple disc-like workpieces in parallel in the vertical direction is provided inside the washing vessel 2, and can be elevated and lowered by an elevating means 14 between a washing position (shown by the continuous lines in FIGS. 1 and 2) at which the workpieces W are substantially immersed in the washing liquid 3 and a non-washing position (shown by the chain line in FIG. 2) at which the workpieces W are substantially exposed from the washing liquid 3. The expression "substantially immersed" does not necessarily mean that the workpieces are perfectly immersed in the washing liquid, but may include such a state.

Figure 3:
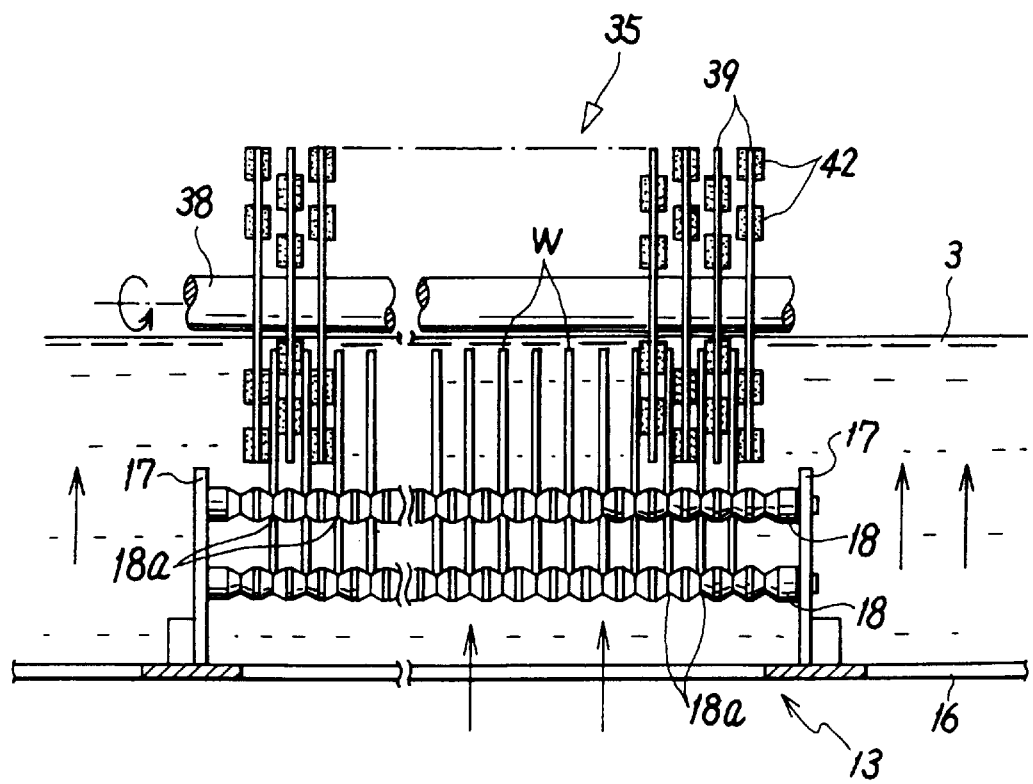
FIG. 3 is a schematic enlarged view of FIG. 1 during the washing process.
Figure 4:
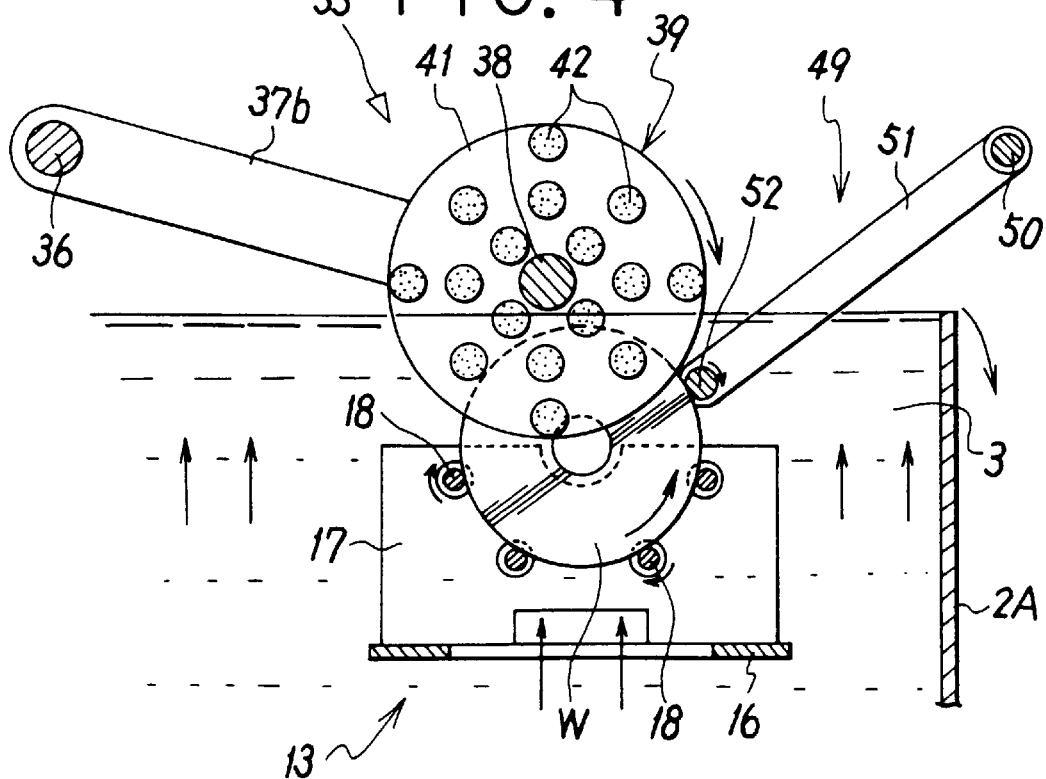
FIG. 4 is a side sectional view of FIG. 3.

As is apparent from FIGS. 3 and 4, the tray 13 consists of a base 16 having an appropriate length to allow the base to be inserted into the inner vessel 2A; a lateral pair of frames 17, 17 installed on the base 16 in such a way as to project at an interval; and multiple rotatable supporting bars 18 that are concentric with the workpiece W and mounted along the circumference of the workpieces W to support the lower halves of said workpieces. Multiple circumferential grooves 18a, in which the outer circumferences of the workpieces W are fitted, are formed in the direction of the axis at specified intervals so that the workpieces W are supported in the vertical direction at the positions of the circumferential grooves 18a.

It is desirable that the structure of the base 16 has many voids to facilitate the rising flow of the washing liquid.

The elevating means 14 for elevating and lowering the tray 13 includes, on both sides of the inner vessel 2A, two elevating shafts 20 that elevationally penetrate the bottom wall of the outer vessel 2B outside the inner vessel 2A. A platelike member 21 is mounted at the upper end of each elevating shaft 20, and the base 16 of the tray 13 is fixed to the lower end of a hanging bar 22 extending downward from the end of the member 21 closest to inner vessel 2A. In the figure, 23 is a guide for the elevating shaft 20.

The lower end of the elevating shaft 20 is fixed to a common plate 24, and a nut member 25 is installed around a screw bar 26 at the center of the plate 24. The upper and lower ends of the screw bar 26 are rotatably supported on the bottom of the washing vessel 2 and the main body 1, and the screw bar 26 is connected to a motor 28 via a gear attached to its lower end. When the screw bar 26 is driven and rotated by the motor 28, the nut member 25 moves along the screw bar 26 in the vertical direction to elevate and lower the tray 13 between the washing position and the non-washing position.

To prevent the washing liquid that overflows from the inner vessel 2A from flowing into a sliding portion between the elevating shaft 20 and the bottom wall of the outer vessel, pipe members 30 for liquid proofing project from the bottom wall of the outer vessel 2B in such a way as to surround the elevating shaft 20. The tip of each pipe member 30 is higher than the position (in the illustrated example, the height of the inner vessel) at which the washing liquid 3 overflows from the inner vessel 2A, while the lower end of each pipe member 30 is fixed to the bottom wall of the outer vessel 2B in a liquid-tight manner by welding. This configuration prevents the washing liquid from flowing into the pipe member 30 from its upper or lower end.

A telescopic bellows 31 that conceals the pipe member 30 is mounted on the bottom surface of the member 21 fixed at the upper end of each elevating shaft 20 in order to prevent the washing liquid from flowing into the pipe member 30 from its upper end. In this case, the lower end of the bellows 31 may or may not be fixed to the bottom wall of the outer vessel 2B.

Since the washing liquid does not flow into the pipe member 30 from its upper end under normal operational conditions, the bellows 31 need not necessarily be provided.

A brush means 35 for washing the workpieces W immersed in the washing liquid is provided in the washing vessel 2. The brush means 35 consists of a first rotatable shaft 36 that traverses the inside of the outer vessel 2B in the upper part of the inner vessel 2A; a horizontal brush shaft 38 that is rotatably supported on the first shaft 36 via a pair of supporting arms 37a and 37b; and multiple washing brushes 39 mounted on the brush shaft 38 at specified intervals.

As is apparent from FIGS. 3 and 4, the washing brush 39 consists of a disc-shaped substrate 41 made of metal such as aluminum, or ceramic or synthetic resin, and washing members 42 made of sponge, fibers, or an appropriate flexible material having a washing capability that are molded integrally with the substrate 41 in such a way as to protrude therefrom. The washing members 42 are rigidly mounted on the brush shaft 38 at the same intervals as used for the workpieces W supported on the tray 13 in such a way that a workpiece W is located exactly midway between the adjacent washing brushes 39.

The side end of the larger-diameter portion 36a of the first shaft 36 is connected to a rod 45a of a cylinder 45 via an operation arm 44 outside the washing vessel 2, and the rod 45a is extended and contracted to rotate the first shaft 36 between a washing position at which some of the washing brushes 39 come into contact with the upper halves of the workpieces W, as shown in FIGS. 3 and 4, and a non-washing position at which the washing brushes 39 are separated from the workpieces W, as shown in FIGS. 1 and 2.

A second shaft 47 that drives the brushes 3a is rotatably built into the larger-diameter portion 36a. One end of a second shaft 47 is connected to the brush shaft 38 via a transmission mechanism built into one of the supporting arms 37a, while the other end is connected outside the washing vessel 2 to a driving source (not shown) that drives and rotates the brush shaft 38.

As shown in FIGS. 3 and 4, the washing brushes 39 rotate, for example, in the direction shown by the arrow while coming into contact with the workpieces that are substantially immersed in the washing liquid 3 in order to wash both surfaces of the workpieces in the flow of the washing liquid 3. In this case, each workpiece W rotates in the direction shown by the arrow due to the frictional force between the workpiece and the washing brushes 39 in such a way that its entire surface is washed. In addition, the washing brushes 39 have their lower halves immersed in the washing liquid 3.

The preferable rotational speed during washing by the washing brushes 39 depends on washing conditions such as the type of workpieces, the type of washing liquid, and the flow velocity of the washing liquid, but is generally about 50 to 100 r.p.m.

A workpiece pressing means 49 is provided to prevent the workpieces W from slipping off the tray 13 during washing by the washing brushes 39. The pressing means 49 has a rotatable supporting shaft 50 that penetrates the outer vessel 2B; a pair of supporting arms 51, 51 attached to the supporting shaft 50; and a presser roller 52 rotatably attached between the supporting arms 51, 51. When a driving means (not shown) connected to the supporting shaft 50 outside the vessel rotates the supporting shaft 50 back and forth through a specified angle, the presser roller 52 rotates between a pressing position at which it abuts the workpieces W and a standby position at which it leaves the workpieces W, as shown in FIGS. 2 and 3.

As shown in FIG. 2, the washing vessel 2 also has a first shower means 54 for spraying the washing liquid against the washing brushes 391 that are moving to the non-washing position; and a second shower means 55 for spraying the washing liquid against the workpieces W lifted from the washing liquid3 after washing, in order to prevent foreign matter from re-attaching to the washing brushes 39 and workpieces W and to prevent the washing brushes 39 and workpieces W from drying.

In a washing apparatus with the above configuration, when multiple workpieces W transferred from a preceding step such as polishing are supplied by a loading mechanism (not shown) to the tray 13, which is standing by at the non-washing position shown by the chain line in FIG. 2, the tray 13 is lowered by the elevating means 14 to the washing position shown by the continuous line in order to substantially immerse the supported workpieces W in the washing liquid 3 in the inner vessel 2A.

The washing liquid 3 is continuously supplied to the inside of the inner vessel 2A through the liquid-supply pipe 4 provided at the bottom of the vessel, and then rises through the inner vessel 2A to overflow from the upper end of the vessel wall.

When the workpieces W are entirely immersed in the washing liquid 3, the presser means 49 is activated to cause the presser roller 52 to abut the sides of the workpieces W. The brush means 35 subsequently moves to the washing position, where the washing brushes rotate, for example, in the direction shown by the arrow while coming into partial contact with the workpieces W in order to wash both surfaces of the workpieces W in the rising flow of the washing liquid 3, as shown in FIGS. 3 and 4. In this case, each workpiece W rotates in the direction shown by the arrow due to the frictional force between the workpiece and the washing brushes 39 in such a way that its entire surface is washed. In addition, the washing brushes 39 have their lower halves immersed in the washing liquid 3.

Since the washing is carried out while the entire workpieces W are in continuous contact with the washing liquid 3, attached foreign matter is easily removed while the washing liquid is prevented from splashing outside the apparatus, in contrast to the situation in conventional washing in which a limited amount of washing liquid is sprayed in the form of a shower.

Furthermore, since the workpieces are brush-washed in the flow of the overflowing washing liquid, foreign matter removed from the workpieces W overflows together with the washing liquid and is discharged quickly from the vessel without re-attaching to the workpieces W or washing brushes 39. In particular, since the washing brushes 39 come into contact with the upper halves of the workpieces W to wash them downstream of the washing liquid flowing upward through the vessel, the removed foreign matter immediately leaves the workpieces W and is then discharged quickly from the vessel. This prevents the foreign matter from flowing to the upstream sides (lower-half sides) of the workpieces and reattaching to them.

In addition, although the rotation of the washing brushes 39 causes the washing liquid to flow horizontally at their positions, this in fact facilitates the discharge of foreign matter associated with the overflow and improves the discharge efficiency because the washing brushes 39 are located at the upper end of the inner vessel 2A, that is, downstream of the flow of the washing liquid, and because the horizontal flow is in the some direction as the flow of the overflowing washing liquid.

Once the washing has been finished, the washing brushes 39 rotate to the non-washing position shown in FIGS. 1 and 2 and the presser roller 52 rotates to its standby position. Subsequently, the elevating means 14 causes the tray 13 to rise to the non-washing position shown in FIG. 2, and an unloading mechanism (not shown) unloads the workpieces W.

The first shower means 54 sprays the washing liquid against the washing brushes 39 being moved up to the non-washing position, and the second shower means 55 sprays the washing liquid onto the workpieces W being lifted from the washing liquid and then moved up to the non-washing position, in order to prevent foreign matter from re-attaching to the workpieces and to prevent the washing brushes 39 and the workpieces W them from drying.

The tray 13, from which the workpieces W have been unloaded, is supplied by the loading mechanism with unwashed workpieces W prior to the repetition of the washing process.

To improve the washing effect, an ultrasonic irradiating means for irradiating the washing liquid 3 with ultrasonic waves may be provided on either the bottom, side, or top surface of the inner vessel 2A. Alternatively, a bubbling means may be provided for bubbling a gas or vapor into the washing liquid 3. The ultrasonic irradiating means and bubbling means may be used together.

As described above, this invention brush-washes the workpieces in the continuous rising flow of the washing liquid from the bottom of the washing vessel in order to remove foreign matter from the workpieces simply and reliably, as well as to allow the removed foreign matter to be discharged quickly from the vessel together with the overflowing washing liquid in order to reliably prevent the foreign matter from re-attaching to the workpieces or washing brushes.

In addition, in contrast to the conventional method that uses a nozzle to spray a washing liquid against a washed portion, this invention can prevent splashing and is safe and clean.

What is claimed is:

1. An overflow scrub-washing apparatus comprising:
    a washing vessel that continuously supplies a washing liquid upward from a liquid-supply pipe provided at the bottom of the vessel such that the liquid overflows from a top portion of the vessel;
    an elevational tray that supports platelike disc workpieces in the vertical direction and parallel with the flow of the liquid to immerse the workpieces in the washing liquid;
    an elevating member for elevating and lowering said tray between a washing position at which the workpieces are immersed in the washing liquid and a non-washing position at which the workpieces are exposed
    a brush member having washing brushes so as to be driven and rotated by a motor, for washing in the flow of the washing liquid the workpieces immersed in the washing liquid while being supported on said tray; and
    a presser member movable between a pressing position where the presser member contacts a periphery of the workpieces and a standby position separated from the workpieces, the presser member being provided separately from the washing brush.

2. An overflow scrub-washing apparatus comprising:
    a washing vessel that continuously supplies a washing liquid upward from a liquid-supply pipe provided at the bottom of the vessel in such a manner that the liquid overflows a top portion of the vessel;
    an elevational tray that supports multiple platelike disc workpieces in the vertical direction and parallel with the flow of the liquid to immerse the workpieces in the washing liquid;
    an elevating member for elevating and lowering said tray between a washing position at which the workpieces are immersed in the washing liquid and a non-washing position at which the workpieces are exposed from the washing liquid; and
    a brush including multiple disc-shaped washing brushes that are drivable and rotatable by a motor, to cause the washing brushes to come into contact with the upper halves of the workpieces that are immersed in the washing liquid while being supported on said tray in order to wish the workpieces in the flow of the washing liquid on the downstream side; and
    a presser member movable between a pressing position where the presser member contacts a periphery of the workpieces and a standby position separated from the workpieces, the presser member being provided separately from the washing brush.

3. An overflow scrub-washing apparatus according to claim 1 or 2 including a shower means for spraying the washing liquid against the washing brushes and workpieces being moved from the washing position to the non-washing position.

4. An overflow scrub-washing apparatus according to claim 1 or 2 having a straightening mechanism provided above the liquid-supply pipe at the bottom of said washing vessel for making parallel the flow of the washing liquid.

5. An overflow scrub-washing apparatus according to claim 1 or 2 having at least one of a bubbling device for blowing bubbles into the washing liquid and an ultrasonic irradiating device for irradiating the washing liquid with ultrasonic waves.

6. An overflow scrub-washing apparatus comprising:
    a washing vessel having a double structure comprising an inner vessel that continuously supplies a washing liquid upward from a liquid-supply pipe provided at the bottom of the vessel in such a way that the liquid overflows a top portion of the vessel, and an outer vessel surrounding the inner vessel to receive the overflowing washing liquid;
    an elevational tray that supports multiple platelike workpieces in the vertical direction and parallel with the flow of the liquid in order to immerse the workpieces in the washing liquid;
    an elevating member having an elevating shaft that elevationally penetrates the bottom wall of the outer vessel outside said inner vessel and on which said tray is mounted, and having a driving source that elevates and lowers the elevating shaft, the elevating member elevating and lowering said tray between a washing position at which the workpieces are immersed in the washing liquid and a non-washing position at which the workpieces are exposed;
    a plurality of pipe members projecting from the bottom wall of the outer vessel in such a way as to surround said elevating shaft, the tips of the pipe members being higher than the position at which the washing liquid overflows, and the lower ends of the pipe members being fixed to the bottom wall of the outer vessel in a liquid-tight manner; and
    a brush having washing brushes that are drivable and rotatable by a motor, for washing in the flow of the washing liquid the workpieces immersed in the washing liquid while being supported on said tray.

7. A washing apparatus according to claim 6 which comprises a bellows mounted so as to cover the upper ends of said pipe members.

8. An overflow scrub-washing apparatus according to claim 6 including a shower for spraying the washing liquid against the washing brushes and workpieces being moved from the washing position to the non-washing position.

9. An overflow scrub-washing apparatus according to claim 6 having a workpiece pressing member preventing the workpieces from slipping off the tray while they are being washed using the washing brushes.

10. An overflow scrub-washing apparatus according to claim 6 having a straightening device provided above the liquid-supply pipe at the bottom of said inner vessel for making parallel the flow of the washing liquid.

11. An overflow scrub-washing apparatus according to claim 6 having at least one of a bubbling device for blowing bubbles into the washing liquid and an ultrasonic irradiating device for irradiating the washing liquid with ultrasonic waves.

* * * * *